(12) United States Patent
Hughes

(10) Patent No.: US 7,002,505 B2
(45) Date of Patent: Feb. 21, 2006

(54) SWITCHED-CURRENT ANALOGUE-TO-DIGITAL CONVERTER

(75) Inventor: John B. Hughes, Hove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/521,670

(22) PCT Filed: Jul. 8, 2003

(86) PCT No.: PCT/IB03/03027

§ 371 (c)(1),
(2), (4) Date: Jan. 18, 2005

(87) PCT Pub. No.: WO2004/010586

PCT Pub. Date: Jan. 29, 2004

(65) Prior Publication Data

US 2005/0242982 A1   Nov. 3, 2005

(30) Foreign Application Priority Data

Jul. 20, 2002  (GB) ................................. 0216897

(51) Int. Cl.
*H03M 1/38* (2006.01)
(52) U.S. Cl. ...................................... 341/161; 341/155
(58) Field of Classification Search ............... 341/155, 341/144, 120, 135, 156, 161
See application file for complete search history.

(56) References Cited

U.S. PATENT DOCUMENTS

| | | | |
|---|---|---|---|
| 4,612,533 A * | 9/1986 | Evans ......................... | 341/120 |
| 5,313,206 A * | 5/1994 | Davies et al. ............... | 341/156 |
| 5,990,820 A * | 11/1999 | Tan .............................. | 341/161 |
| 6,084,539 A * | 7/2000 | Yamada ...................... | 341/155 |
| 6,313,780 B1 * | 11/2001 | Hughes et al. .............. | 341/156 |
| 6,340,944 B1 * | 1/2002 | Chang et al. ................ | 341/161 |
| 6,515,611 B1 * | 2/2003 | Fetterman et al. .......... | 341/161 |

* cited by examiner

*Primary Examiner*—Peguy JeanPierre
(74) *Attorney, Agent, or Firm*—Peter Zawilski

(57) ABSTRACT

An current mode analogue-to-digital converter uses a conversion stage which operates using a two-phase clock and which requires the input signal to be present during only one of the phases. A sample-and-hold circuit (120, 130, 135) samples the input signal during the first clock phase and during the second clock phase a quantised bit value is generated from a mirror of the held input current by a kickback-free comparator circuit (140). Also during the second clock phase a residue is generated using the quantised value and a non-mirrored version of the held input current. Optionally, two comparator circuits (140, 140") may be used to provide two-level quantisation, enabling errors introduced by the current mirror to be corrected by a Redundant Signed Digit algorithm. Two pipelines of conversion stages ($S_i'$, $S_i''$) can be multiplexed to double the conversion rate.

8 Claims, 10 Drawing Sheets

| Conversion stage | Element | Clock Phase $\Phi_1$ | Clock Phase $\Phi_2$ |
|---|---|---|---|
| $S_i$ odd $i$ | Current memory means (130) | Sampling | Holding |
| | Comparator means (140) | Resetting | Quantising |
| | DAC (150) | OFF | ON |
| $S_i$ even $i$ | Current memory means (130) | Holding | Sampling |
| | Comparator means (140) | Quantising | Resetting |
| | DAC (150) | ON | OFF |

Fig. 14

| Conversion stage | Element | Clock Phase $\Phi_1$ | Clock Phase $\Phi_2$ |
|---|---|---|---|
| $S_i$ odd $i$ | Current memory means (130) | Sampling | Holding |
| | Comparator means (140') | Quantising | Resetting |
| | DAC (150) | OFF | ON |
| $S_i$ even $i$ | Current memory means (130) | Holding | Sampling |
| | Comparator means (140') | Resetting | Quantising |
| | DAC (150) | ON | OFF |

Fig. 15

| Conversion stage | Element | Clock Phase $\Phi_1$ | Clock Phase $\Phi_2$ |
|---|---|---|---|
| $S'_i$, odd $i$ | Current memory means (130) | Sampling | Holding |
| | Comparator means (140) | Resetting | Quantising |
| | DAC (150) | OFF | ON |
| $S'_i$, even $i$ | Current memory means (130) | Holding | Sampling |
| | Comparator means (140) | Quantising | Resetting |
| | DAC (150) | ON | OFF |
| $S''_i$, odd $i$ | Current memory means (130) | Holding | Sampling |
| | Comparator means (140) | Quantising | Resetting |
| | DAC (150) | ON | OFF |
| $S''_i$, even $i$ | Current memory means (130) | Sampling | Holding |
| | Comparator means (140) | Resetting | Quantising |
| | DAC (150) | OFF | ON |

Fig. 16

SWITCHED-CURRENT ANALOGUE-TO-DIGITAL CONVERTER

This application is a 371 of PCT/IB03/03027 filed on Jul. 08, 2003.

The invention relates to a switched-current pipeline analogue-to-digital converter and an electronic device comprising such a converter.

Figure 1:
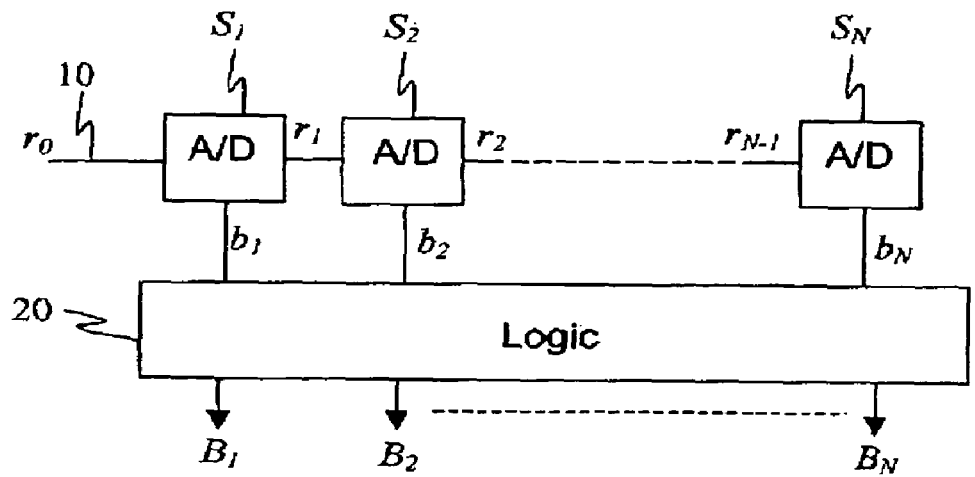
Figure 2:
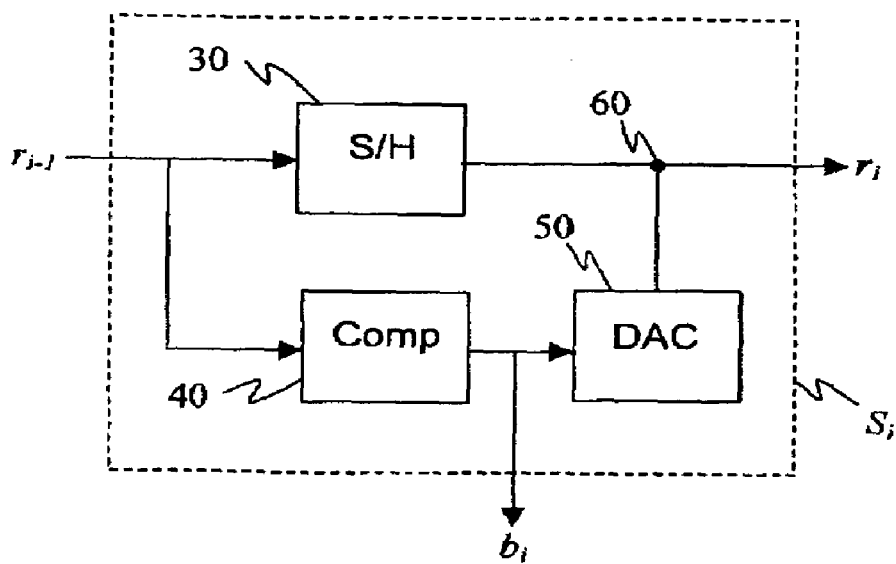

The general architecture of a typical N-bit switched-current pipeline analogue-to-digital converter (ADC) is illustrated in FIG. 1. It comprises an analogue current input 10 and N cascaded conversion stages $S_1 \ldots S_N$. Each stage generates one bit $b_1 \ldots b_N$ and, except for the last stage, an analogue residue current $r_1 \ldots r_{N-1}$ which is passed to the following stages for conversion. De-skew logic 20 re-times the bits and provides bits $B_1 \ldots B_N$ simultaneously. The general architecture of each conversion stage $S_i$, except the last $S_N$, is illustrated in FIG. 2 and comprises a sample-and-hold (S/H) circuit 30 for sampling the input current $r_{i-1}$, a current comparator 40 for generating one bit $b_i$ by comparing the input current $r_{i-1}$ with a reference threshold current, a current digital-to-analogue converter (DAC) 50 for converting the bit $b_i$ to a current, and a summing means 60 for generating the residue current $r_i$ as the difference between the input current $r_{i-1}$, as delivered via the current memory 30, and the current delivered by the DAC 50, $I_{DAC}$. The last conversion stage $S_N$ has only a current comparator 40, for providing $b_N$, as no residue is required.

A fast conversion speed is required in electronic devices that process signals having a wide bandwidth. An example of such an electronic device is a wireless receiver in which a received signal is digitised before demodulation in a digital signal processor. Another example of such an electronic device is a digital recorder that incorporates an ADC for converting an analogue signal to a digital signal prior to writing the digital signal to a recording medium. In order to achieve a fast conversion speed in an ADC it is desirable to use an architecture that reduces the number of operating phases. The use of a two-phase clock enables the clock rate to be minimised, resulting in reduced power consumption or a higher conversion rate in electronic devices comprising an ADC.

U.S. Pat. No. 5,990,820 discloses a switched-current pipeline ADC that uses two-phase operation. The S/H circuit 30 samples its input current on one phase and the current comparator 40 generates a bit $b_i$ during the other phase. Therefore, this prior art ADC requires the input current $r_{i-1}$ to each conversion stage $S_i$ to be present on both phases. Consequently, the residue current $r_i$ provided at the output of each conversion stage $S_i$ must also be present on both phases. To enable the S/H circuit 30 to deliver current to the summing means 60 during the sampling phase, as well as during the holding phase, it includes a current mirror. However, a current mirror has a mismatch error which limits the precision of the conversion process. Therefore, a disadvantage of the two-phase ADC disclosed in U.S. Pat. No. 5,990,820 is the mismatch error resulting from the use of a current mirror in the S/H circuit 30.

Figure 10:
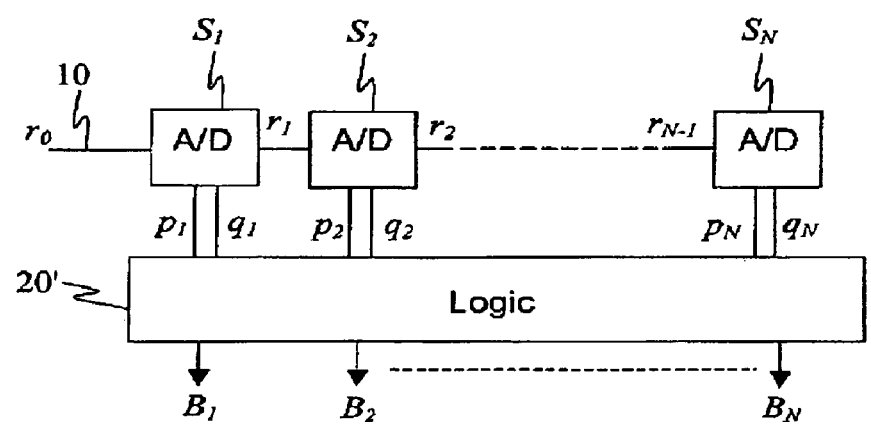

In "A 10-bit Pipelined Switched-Current A-D Converter", D. Macq, IEEE Jnl of Solid-State Circuits, August 1994, pp. 967–971, the use of an algorithm for improving conversion accuracy is described, known as the Redundant Signed Digit (RSD) algorithm. The RSD algorithm requires at each conversion stage $S_i$ the generation of, instead of a single bit $b_i$, two values $p_i$ and $q_i$ generated by comparing the input current $r_{i-1}$ with two reference threshold currents $\pm I_{ref}$. There is, therefore, a threshold band of $2I_{ref}$ for the conversion stage. The pair of outputs, $p_i$ and $q_i$, for the conversion stage $S_i$ indicates whether the input current $r_{i-1}$ is significantly positive ($p_i=1$, $q_i=0$), in which case $I_{DAC}$ is subtracted from the input current $r_{i-1}$ in the summing means 60, whether the input current $r_{i-1}$ is significantly negative ($p_i=0$, $q_i=1$), in which case $I_{DAC}$ is added to the input current $r_{i-1}$, or whether the input current $r_{i-1}$ is neither significantly positive nor significantly negative ($p_i=0$, $q_i=0$), in which case nothing is added to or subtracted from the input current $r_{i-1}$. In this way the accuracy with which the the input current $r_{i-1}$ polarity is determined can be relaxed and the errors this causes are corrected in digital correction logic. FIG. 10 illustrates the architecture of an N-bit switched-current pipeline ADC using an RSD algorithm. It is identical to the ADC illustrated in FIG. 1, except that each conversion stage $S_i$ generates digital outputs $p_i$ and $q_i$ and the de-skew logic 20' includes digital correction logic to generate the bit $b_i$ from $p_i$ and $q_i$. The architecture illustrated in FIG. 10 is commonly referred to as a 1.5 bit/stage pipeline structure. However, the RSD algorithm is applicable only to the compensation of errors in the bit generation part of each conversion stage $S_i$, as performed by the current comparator 40, and is not applicable to the compensation of errors in the S/H circuit 30, so cannot be used to correct for the errors introduced by the current mirrors in the S/H circuit of the ADC architecture of U.S. Pat. No. 5,990,820.

A known technique for increasing the conversion speed is to multiplex two or more pipelines of conversion stages, such that bits $b_1 \ldots b_N$ are produced sequentially from the different pipelines, thereby multiplying the conversion rate by the number of pipelines.

An object of the invention is to provide an improved switched-current pipeline analogue-to-digital converter and electronic device comprising such a converter.

According to a first aspect of the invention there is provided a current mode pipelined analogue-to-digital converter (ADC) comprising a plurality of serially connected conversion stages wherein at least one conversion stage comprises, a stage input for receiving a current for conversion, a sample-and-hold (S/H) circuit coupled to sample the current at the stage input during a first time period and to hold the sampled current during a second time period, the S/H circuit having first and second outputs, the first output delivering a mirror of the sampled current during the first time period and a mirror of the held current during the second time period and the second output delivering the held current directly during the second time period, a current comparator means having an input coupled to the first output of the S/H circuit for comparing a current at said input with one or more reference currents, a digital output coupled to an output of the current comparator means for producing a digital signal representing the digital conversion performed by the stage, a digital-to-analogue converter (DAC) having an input coupled to the output of the current comparator means, and a summing means having a first input coupled to an output of the DAC, a second input coupled to the second output of the S/H circuit, and an output for delivering a residual current during the second time period.

The combined first and second time periods correspond to one clock period. The input current to the conversion stage defined by the invention need be present for only the first time period, while the S/H circuit is sampling. The residual current is provided only during the second time period when the S/H circuit is in its hold state and providing a direct, i.e. non-mirrored, current to the summing means 160, thereby avoiding the need to supply the summing means 160 from a current mirror, and therefore avoiding the inherent mismatch error of a current mirror. When such conversion stages are cascaded, the operation during the two time periods of adjacent stages is interchanged such that each stage provides a residual current to the following stage while that following stage is sampling.

Two or more pipelines of conversion stages may be operated with the sampling periods of corresponding stages of each pipeline multiplexed. In this way it is possible to implement an ADC with a higher conversion rate of two or more samples per clock period. The S/H circuit supplies a mirrored current to the current comparator means. Optionally a plurality of mirrored currents may be supplied to respective current comparator means. In this case the digital signal delivered at the output of each current comparator means is available for application of an RSD algorithm for improving conversion accuracy, and the DAC has a plurality of inputs each coupled to the output of a respective current comparator means.

According to a second aspect of the invention there is provided an electronic device comprising an ADC in accordance with the first aspect of the invention.

Figure 3:
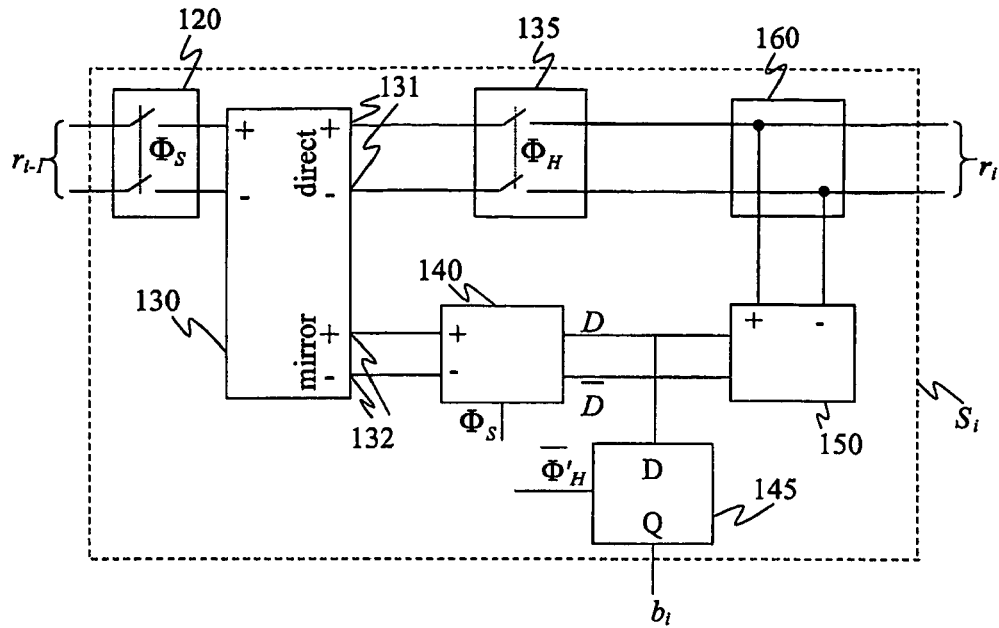
Figure 4:
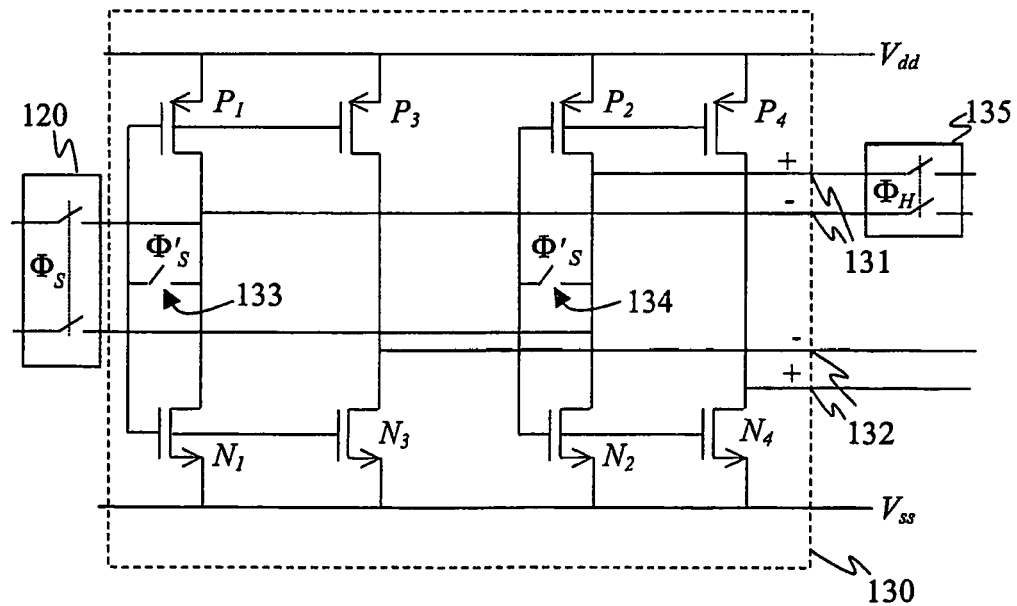
Figure 5:
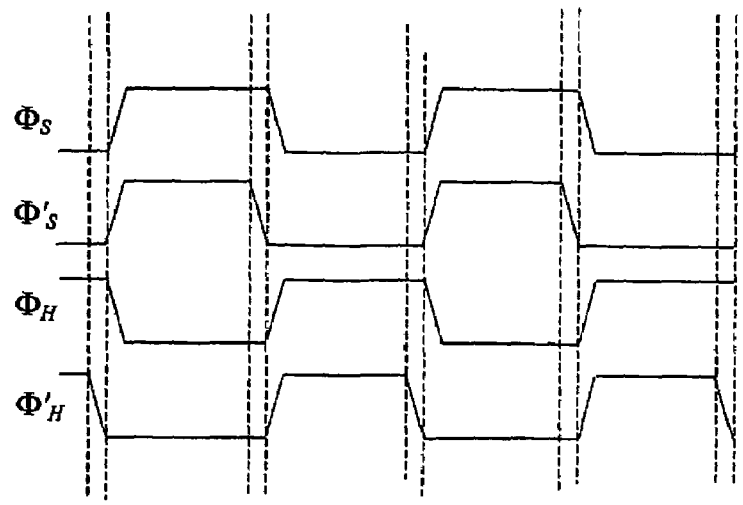
Figure 6:
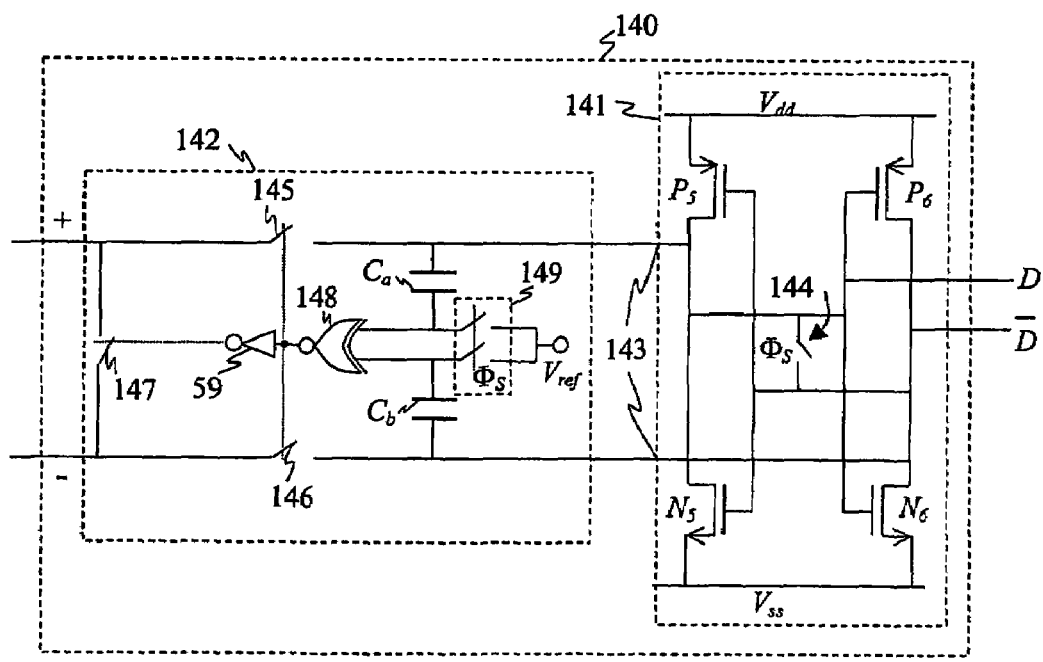
Figure 7:
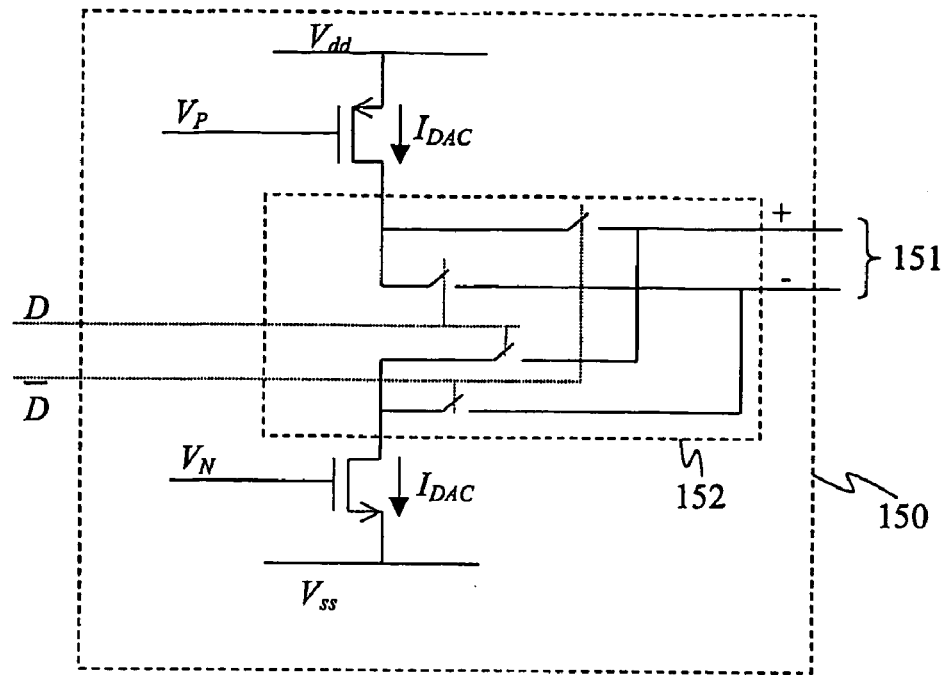
Figure 8:
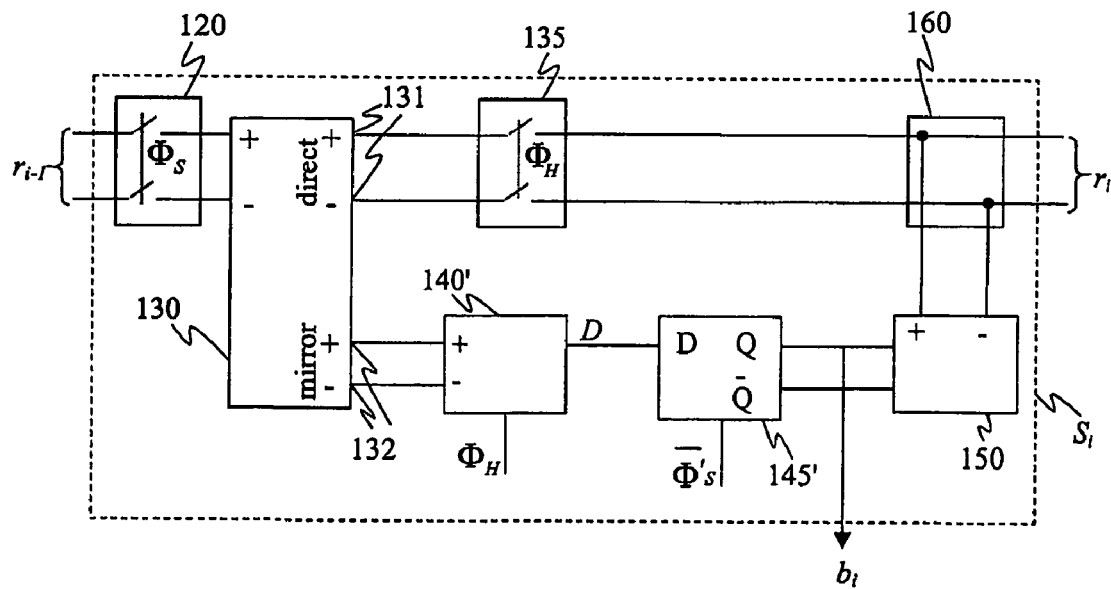
Figure 9:
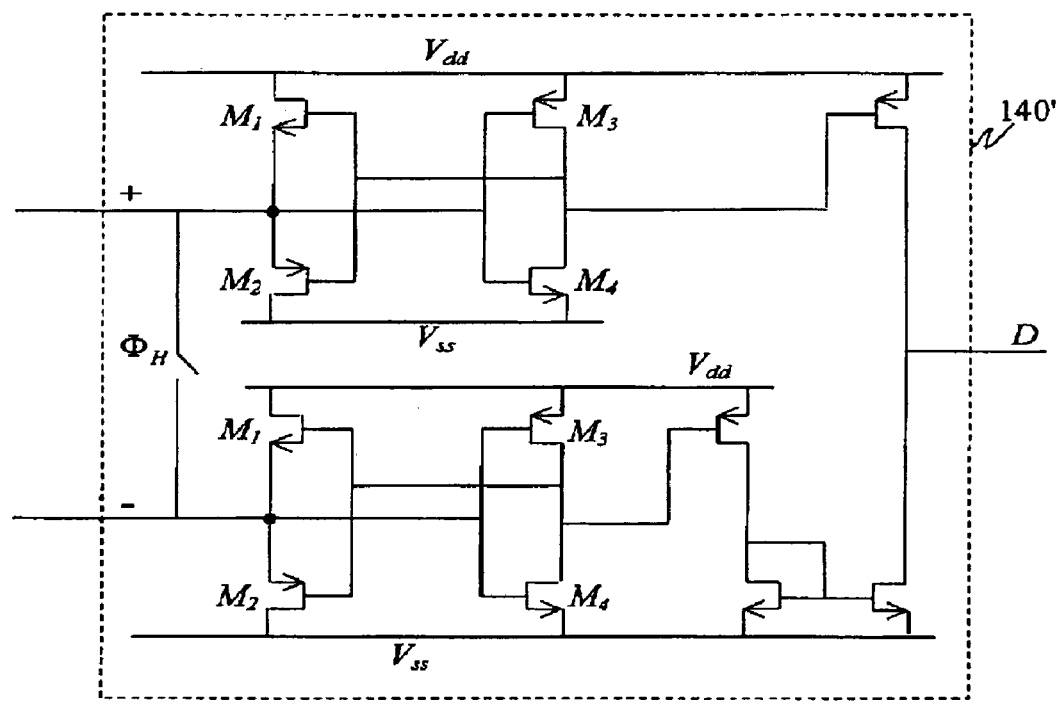
Figure 11:
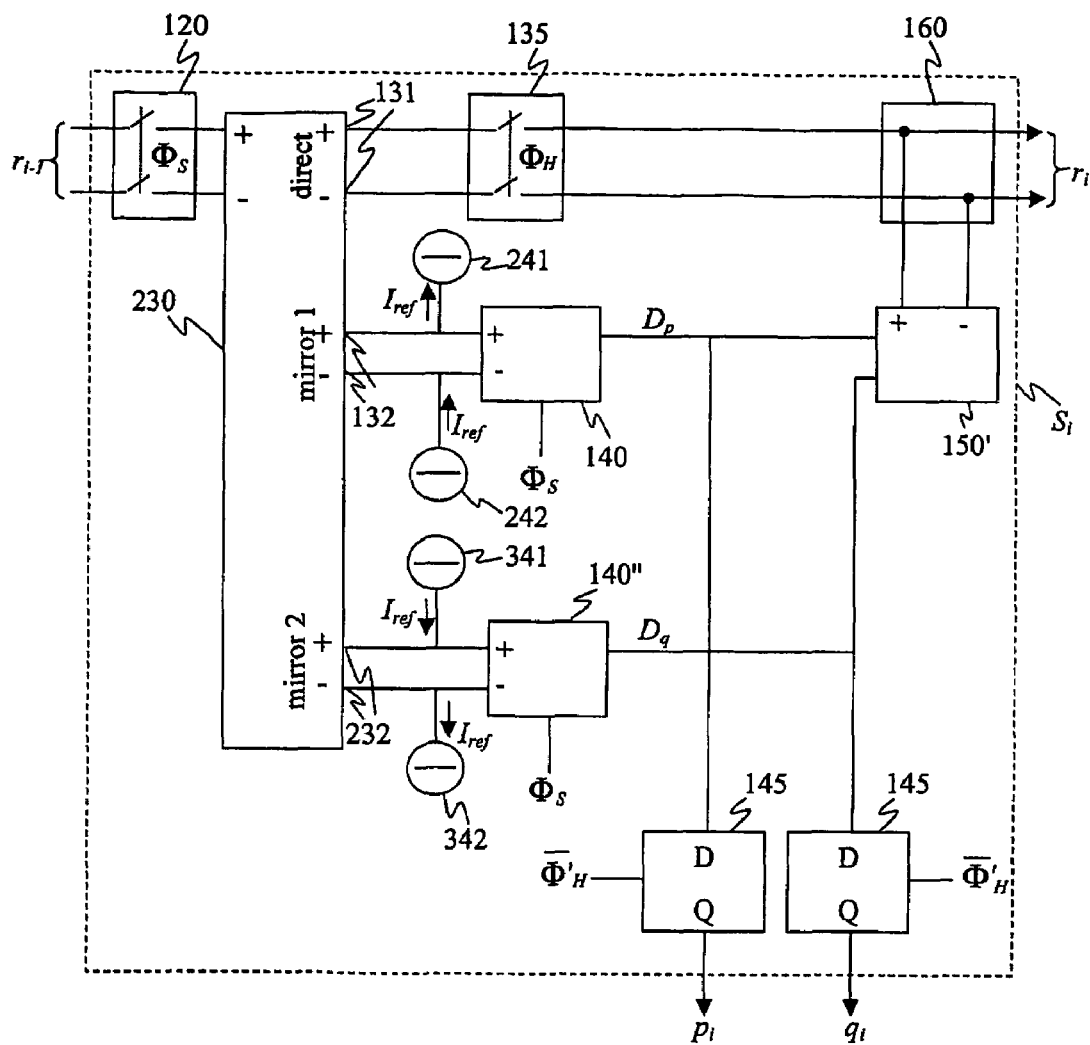
Figure 12:
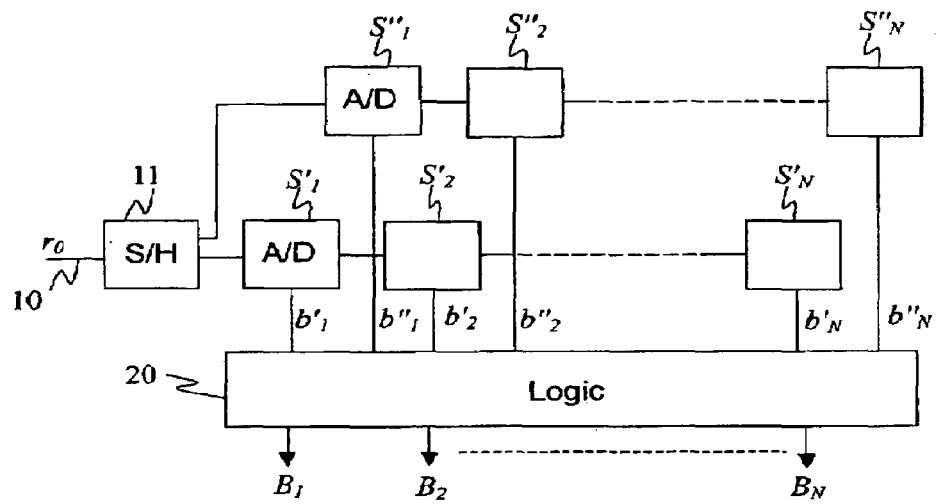
Figure 13:
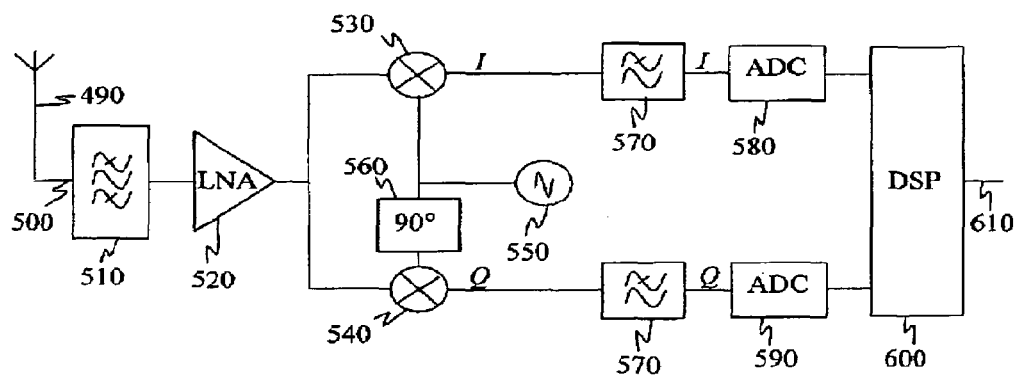
Figure 17:
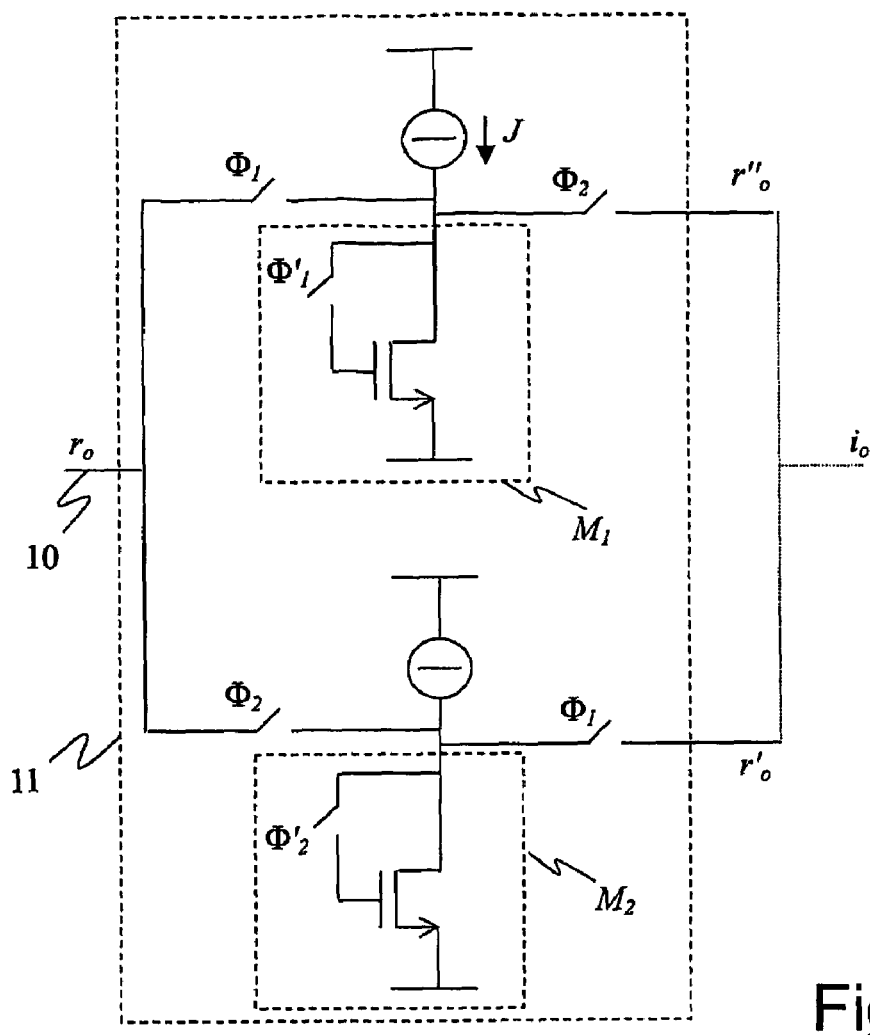
Figure 18:
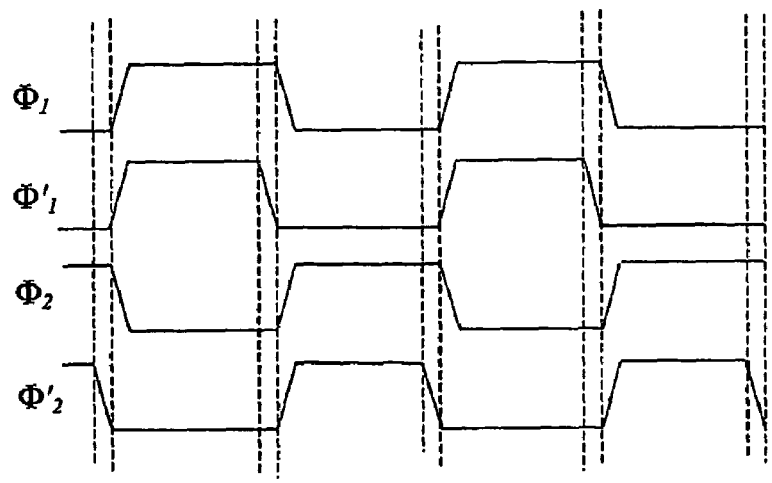
Figure 19:
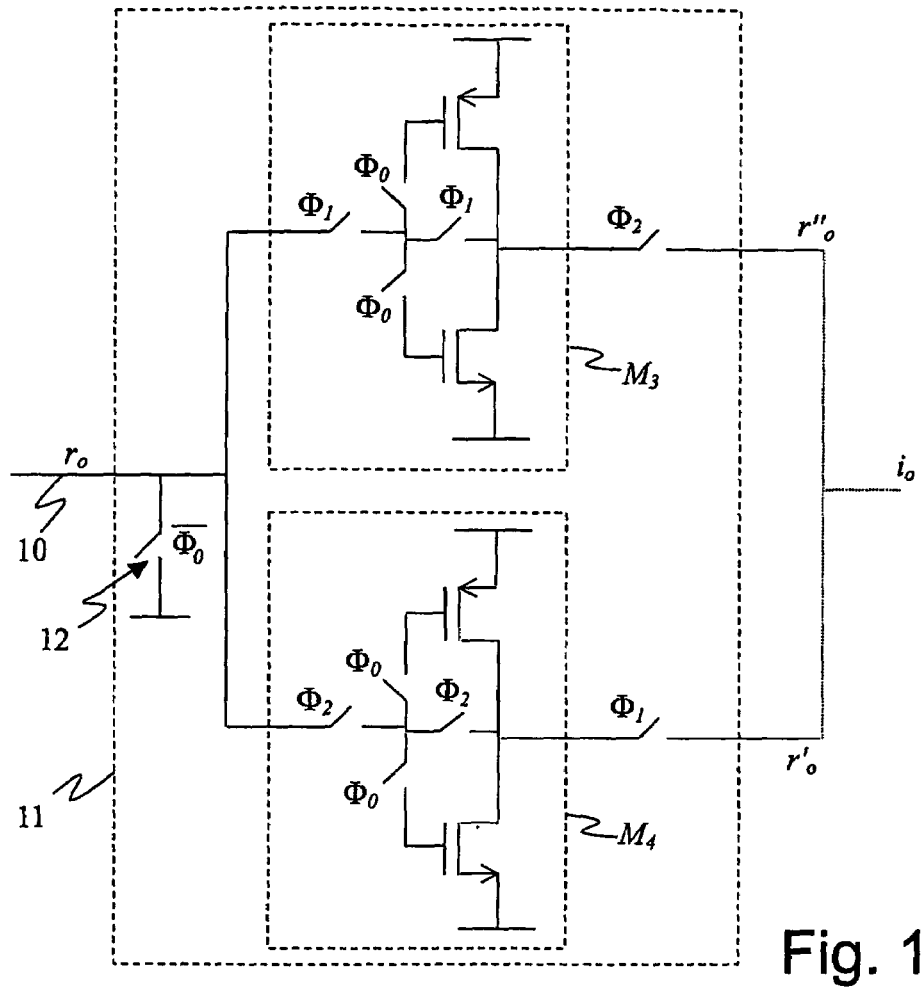
Figure 20:
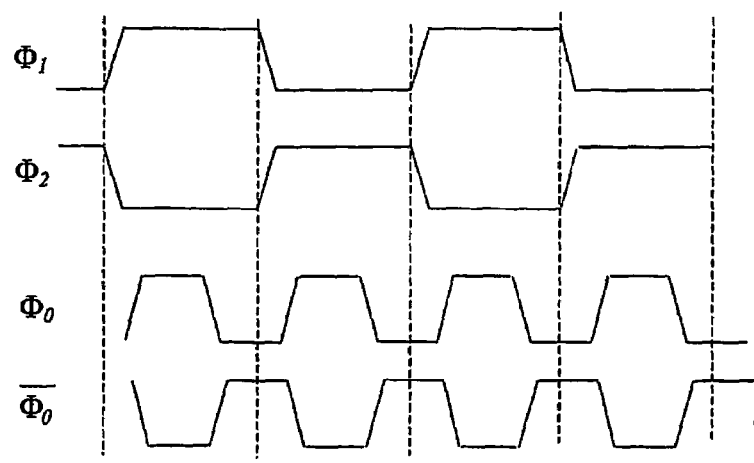

The invention will now be described, by way of example, with reference to the accompanying drawings wherein:

FIG. 1 illustrates the general architecture of a 1 bit/stage N-bit switched-current pipeline ADC, FIG. 2 illustrates a prior art architecture of a conversion stage, FIG. 3 is a block schematic diagram of a first embodiment of a conversion stage in accodance with the invention, FIG. 4 is a schematic diagram of a S/H circuit, FIG. 5 is a timing diagram for the S/H circuit of FIG. 4, FIG. 6 is a schematic diagram of a current comparator means comprising a regenerative circuit, FIG. 7 is a schematic diagram of a DAC, FIG. 8 is a block schematic diagram of a second embodiment of a conversion stage, FIG. 9 is a schematic diagram of a non-regenerative comparator means, FIG. 10 illustrates the general architecture of an N-bit switched-current pipeline ADC including an RSD algorithm, FIG. 11 is a block schematic diagram of a third embodiment of a conversion stage, FIG. 12 is a block schematic diagram of an ADC having two pipelines of conversion stages multiplexed, FIG. 13 is a block schematic diagram of an electronic device comprising an ADC, FIG. 14 is a table of the states of ADC elements, for an ADC comprising the conversion stage of FIG. 3, FIG. 15 is a table of the states of ADC elements, for an ADC comprising the conversion stage of FIG. 8, FIG. 16 is a table of the states of ADC elements, for an ADC comprising multiplexed pipelines and the conversion stage of FIG. 3, FIG. 17 is a schematic diagram of a S/H circuit suitable for supplying two pipelines of conversion stages, FIG. 18 is a timing diagram for the S/H circuit of FIG. 17, FIG. 19 is a schematic diagram of an alternative S/H circuit suitable for supplying two pipelines of conversion stages, and FIG. 20 is a timing diagram for the S/H circuit of FIG. 19.

The invention uses the general ADC architecture illustrated in FIG. 1 and described above, so this architecture will not be described again, but does not use the known general architecture of the conversion stage illustrated in FIG. 2.

The first embodiment of a conversion stage $S_i$ illustrated in FIG. 3 comprises a current memory means 130. The current memory means 130 comprises a balanced class AB switched-current memory circuit. An input current, which is either the residue current $r_{i-1}$ from the previous conversion stage or, in the case of the first conversion stage of the pipeline $S_1 \ldots S_N$, the initial current $r_0$ prior to any conversion, is coupled to a balanced input of the current memory means 130 by means of a first switch means 120. The first switch means 120 operates to couple the input current to the balanced input of the current memory means 130 during a sampling period $\Phi_S$ and to decouple the input current during a holding period $\Phi_H$. The sampling period $\Phi_S$ alternates for alternate conversion stages $S_i$ of the pipeline. For example the even numbered input currents $r_0, r_2, r_4 \ldots$ etc are coupled during a first clock phase $\Phi_1$ of a two-phase clock and decoupled during a second clock phase $\Phi_2$, whereas the odd numbered input currents $r_1, r_3, r_5 \ldots$ etc are coupled during the second clock phase $\Phi_2$ and decoupled during the first clock phase $\Phi_1$. The two clock phases $\Phi_1$ and $\Phi_2$ are non-overlapping.

The current memory means 130 comprises a direct output 131 and a mirror output 132, both outputs being balanced outputs. The direct output 131 is coupled to an input of a second switch means 135 which operates to couple the direct output 131 to an input of a summing means 160 during the holding period $\Phi_H$ and to decouple the direct output 131 from the summing means 160 during the sampling period $\Phi_S$. The current present at the direct output 131 during the holding period $\Phi_H$ is a replica of the input current at the end of the sampling period $\Phi_S$. The current present at the mirror output 132 during the sampling period $\Phi_S$ is a replica of the input current and during the holding period $\Phi_H$ this value of the current is maintained. The combination of the current memory means 130, the first switch means 120 and the second switch means 135 constitutes a S/H circuit.

The mirror output 132 of the current memory means 130 is coupled to a differential input of a comparator means 140. The comparator means 140 is arranged to reset during the sampling period $\Phi_S$, and during the holding period $\Phi_H$ regeneratively amplifies the current present at the mirror output 132. The direction of regeneration is determined by the polarity of the current present at the mirror output 132. The comparator means 140 has a pair of outputs which provide a quantised value D and the inverse $\overline{D}$. The D output of the comparator means 140 is coupled to the input of a D-type flip-flop 145 which is clocked on the rising edge of the holding period $\overline{\Phi'_H}$ and provides on an output a value of bit $b_i$ from the conversion stage. The D and $\overline{D}$ outputs of the comparator means 140 are coupled to respective inputs of a digital-to-analogue converter (DAC) 150 which converts the quantised value D to a bit current. The bit current is coupled to the summing means 160 by means of a third switch means 155 which operates to couple the bit current to the summing means during the holding period $\Phi_H$ and to decouple the bit current from the summing means during the sampling period $\Phi_S$.

The summing means 160 is arranged to form, during the holding period $\Phi_H$, the difference between the bit current and the current at the direct output 131, thereby providing on an output from the conversion stage $S_i$ the residue $r_i$.

FIG. 4 illustrates a S/H circuit comprising the current memory means 130, the first switch means 120 and the second switch means 135. The current memory means 130 comprises first and second complementary PMOS/NMOS transistor pairs $P_1/N_1$ and $P_2/N_2$ each pair forming, in conjunction with respective switch means 133 and 134, a single ended class AB current memory cell, and together forming a balanced class AB current memory cell. An input current is stored in the balanced memory cell during a period $\Phi'_S$ when third and fourth switch means 133 and 134 are closed, which occurs during the sampling period $\Phi_S$, and the stored current is provided on the direct output 131 during the holding period $\Phi_H$ when the switch means 133 and 134 are open. The current memory means 130 also comprises third and fourth complementary PMOS/NMOS transistor pairs $P_3/N_3$ and $P_4/N_4$ coupled to provide a mirror on the mirror output 132 of the current in the balanced class AB current memory cell. As stated above, the current present at the mirror output 132 during the sampling period $\Phi_S$ is a replica of the input current, and during the holding period $\Phi_H$ this value of the current is maintained. All switches in the embodiments described in the present specification may be implemented as MOS transistors.

The timing relationship between $\Phi_S$, $\Phi'_S$ and $\Phi_H$ is illustrated in FIG. 5, a high level corresponding to closed switch means. The duration of the rising and falling edges of the switching transitions is exaggerated to demonstrated that the sampling during period $\Phi'_S$ terminates slightly before the input current is decoupled by the first switch means 120 at the end of period $\Phi_S$, to ensure that the stored current is not distorted by the decoupling action.

Referring to FIG. 6, the comparator means 140 comprises a regenerative comparator circuit 141 and a decoupling means 142. The regenerative comparator circuit 141 comprises two transconductors connected in a positive feedback loop, having complementary PMOS/NMOS transistor pairs $P_5/N_5$ and $P_6/N_6$ giving transconductances $G_m$, and a reset switch 144 which is closed during the sampling period $\Phi_S$ and has on-resistance $R_{on}$. When the reset switch 144 is closed, and with an input current $I_{in}$ flowing at the input 143 of the comparator circuit 141, the voltage across the reset switch 144 is $$\frac{I_{in}}{\frac{1}{R_{on}} - \frac{G_m}{2}}.$$

The loop is stable provided $$R_{on} \le \frac{2}{G_m}.$$

When the reset switch 144 is closed the regenerative comparator circuit 141 is reset, i.e. all memory of the comparator's previous state is removed. When the reset switch 144 is opened, the condition for stability no longer holds and the voltage across the reset switch 144 is amplified regeneratively in a direction determined by its initial polarity until it reaches the supply rail voltages $V_{SS}$ and $V_{dd}$. The speed of regeneration is dependent on the size of the input current $I_{in}$. Small input currents produce slow regeneration and large input currents produce rapid regeneration. The regeneration process can result in the phenomenon termed "kickback" which can limit the accuracy of the conversion process. Kickback would occur if large voltage swings at either side of the reset switch 144 are allowed to be transmitted back to the mirror output 132 of the current memory means 130, thereby corrupting the signal. The purpose of the decoupling means 142 is to prevent such kickback.

The decoupling means 142 comprises decoupling switches 145, 146 for decoupling from the regenerative comparator circuit 141 signals received from the mirror output 132, and also comprises a bypass switch 147 for providing a current path when the regenerative comparator circuit 141 is decoupled from the mirror output 132.

The decoupling means 142 is arranged to monitor the degree of regeneration and to open the decoupling switches 145, 146 when the degree of regeneration reaches a predetermined value, as follows. Gate means 148, providing a NOR function, has first and second gate inputs coupled to, respectively, either side of the reset switch 144 by means of respective first and second capacitors $C_a$ and $C_b$. The first and second gate inputs are also coupled to a voltage reference source $V_{ref}$ by means of reference switch means 149. The reference switch means 149 couples the first and second gate inputs to the voltage reference source $V_{ref}$ throughout the sampling period $\Phi_S$, when the reset switch 144 is also closed, and decouples them throughout the holding period $\Phi_H$ during which the regenerative comparator circuit 141 regenerates. The voltage of the voltage reference source $V_{ref}$ is below the switching threshold of the gate means 148.

In operation, during the sampling period $\Phi_S$ the first and second gate inputs are forced to voltage $V_{ref}$ and the first and second capacitors $C_a$ and $C_b$ charge to the difference voltages between $V_{ref}$ and the voltages either side of the reset switch 144. Because $V_{ref}$ is below the switching threshold of the gate means 148, the gate provides a logical high level output which is arranged to maintain the decoupling switches 145, 146 closed and the bypass switch 147 open. At the start of the holding period $\Phi_H$ the reference switch means 149 decouples the first and second gate inputs from the voltage reference source $V_{ref}$, but instantaneously the voltages at the first and second gate inputs are held at voltage $V_{ref}$ by the charge on the first and second capacitors $C_a$ and $C_b$. As regeneration ensues, the voltages either side of the reset switch 144 move towards the supply rail voltages, one to $V_{SS}$ and the other to $V_{dd}$, depending on the polarity of the current at the mirror output 132, and these voltage changes are transmitted to, respectively, the first and second gate inputs via, respectively, the first and second capacitors $C_a$ and $C_b$. When the voltage at either the first or second gate input goes above the switching threshold of the gate means 148, the voltage at the gate output goes to a logical low level, thereby causing the decoupling switches 145, 146 to decouple the mirror output 132 from the regenerative comparator circuit 141 and the bypass switch 147 to close, thereby providing a current path for the signal at the mirror output 132. In this way, the direction of regeneration is established reliably but the current memory means 130 is isolated before regeneration has reached damaging proportions. Output voltages for the quantised value D and the inverse $\overline{D}$ are provided from the voltage either side of the reset switch 144.

Direct coupling of the current memory means 130 to the comparator means 140 is only possible because of the absence of kickback as described above. If comparator means 140 did not have the means to prevent kickback, kickback could occur during the holding period and the signals at the direct output 131 and the mirror output 132 of the current memory means 130 would have been corrupted, resulting in corruption of the quantised value D, and consequently corruption of the residue $r_i$.

Referring to FIG. 7, the DAC 150 is a balanced current-mode 1-bit device. It comprises means for creating two DC currents of equal value but opposite polarity, $\pm I_{DAC}$ which are coupled to a balanced output 151 by means of a reversing switch arrangement 152 controlled by the quantised values D and $\overline{D}$ provided by the outputs of the comparator means 140. The reversing switch arrangement 152 enables the two DC currents $\pm I_{DAC}$ at the balanced output 151 to be reversed. The value of the two DC currents $\pm I_{DAC}$ is halved for each successive conversion stage $S_i$ of the ADC. This allows the summing means 160 to be implemented using simple wired connections and without the need to double the residue.

The table of FIG. 14 summarises the states of the ADC elements for each phase, $\Phi_1, \Phi_2$, of a two-phase clock and for odd and even conversion stages $S_i$, for an ADC comprising the conversion stage of FIG. 3. For odd numbered conversion stage $S_i$ i=1, 3, . . . etc, during the first clock phase $\Phi_1$ the current memory means 130 is sampling, the comparator means 140 is resetting and the DAC 150 is OFF, meaning that it is decoupled from the summing means 160 by the third switch means 155. For even numbered conversion stage $S_i$ i=2, 4, . . . etc, during the first clock phase $\Phi_1$ the current memory means 130 is holding, the comparator means 140 is quantising the current at the mirror output 132 and the DAC 150 is ON, meaning that it is coupled to the summing means 160 by the third switch means 155. During the second clock phase $\Phi_2$ the status of the odd and even conversion stages are interchanged.

A second embodiment of a conversion stage $S_i$ is illustrated in FIG. 8. This second embodiment uses a non-regenerative circuit for the comparator means as an alternative way to avoid the generation of kickback. This non-regenerative comparator means is denoted by reference numeral 140' in FIG. 8. Elements which are identical in FIG. 3 and FIG. 8 have the same reference numeral and will not be described again; only the differences are described, as follows. In FIG. 8, the D-type flip-flop 145' is coupled between the non-regenerative comparator means 140' and the DAC 150 in order to latch the signal at the output of the non-regenerative comparator means 140', and outputs of D-type flip-flop 145' provide the quantised value D and its inverse $\overline{D}$ to the DAC 150. The non-regenerative comparator means 140' has a low input impedance which protects the current memory means 130 from kickback from the D-type flip-flop 145'. Referring to FIG. 9, the non-regenerative comparator means 140' is a balanced circuit comprising voltage gain stages $M_3/M_4$ with source-follower feedback $M_1/M_2$ to provide a low input impedance.

The table of FIG. 15 summarises the states of the ADC elements for each phase, $\Phi_1, \Phi_2$, of a two-phase clock and for odd and even conversion stages $S_i$, for an ADC comprising the conversion stage of FIG. 8. For odd numbered conversion stage $S_i$ i=1, 3, . . . etc, during the first clock phase $\Phi_1$ the current memory means 130 is sampling, the comparator means 140' is quantising the current at the mirror output 132 and the DAC 150 is OFF. For even numbered conversion stage $S_i$ i=2, 4, . . . etc, during the first clock phase $\Phi_1$ the current memory means 130 is holding, the comparator means 140' is resetting and the DAC 150 is ON. During the second clock phase $\Phi_2$ the status of the odd and even conversion stages are interchanged.

A third embodiment of a conversion stage $S_i$ which generates values for $p_i$ and $q_i$ for use in an RSD algorithm is illustrated in FIG. 11. Elements which are identical in FIG. 3 and FIG. 11 have the same reference numeral and will not be described again; only those elements that differ are described below. In FIG. 11, the current memory means 230 comprises a direct output 131 and a first mirror output 132, the same as the current memory means 130, but in addition comprises a second current mirror and second mirror output 232. Both the first and second mirror outputs 132, 232 are balanced. The current present at the second mirror output 232 during the sampling period $\Phi_S$ is a replica of the input current, and during the holding period $\Phi_H$ this value of the current is maintained. The first and second mirror outputs 132, 232 are coupled to, respectively, first and second comparator means 140', 140'' which are identical. Current sources 241, 242 coupled to the first mirror output 132 thereby setting the switching threshold of the first comparator means 140' to $+I_{ref}$ and current sources 341, 342 coupled to the second mirror output 232 set the switching threshold of the second comparator means 140'' to $-I_{ref}$. An output from each of the first and second comparator means 140', 140'' is coupled to an input of respective D-type flip-flops 145 which provide on respective outputs a value for $p_i$ and $q_i$. The output from each of the first and second comparator means 140', 140'' is also coupled to respective inputs of a digital-to-analogue converter (DAC) 150' which converts to a DC current the quantised values $D_p$, $D_q$ output from the first and second comparator means 140', 140'' respectively. The values of the DAC output current and of $I_{ref}$ are halved in successive conversion stages. In the present embodiment, the quantised values $D_p$, $D_q$ can take one of three combinations, [0,0], [0,1] or [1,0], therefore the DAC 150' can be considered as a 1½-bit DAC. The DAC 150' in the embodiment of FIG. 11 can use the same circuit as the DAC 150 in the embodiments of FIG. 3 and 8 with $D_p$ being equivalent to D and $D_q$ being equivalent to $\overline{D}$.

Optionally, the conversion stage illustrated in FIG. 11 which generates values for $p_i$ and $q_i$ may comprise two non-regenerative comparator means 140' instead of regenerative comparator means 140', 140'', in which case the two D-type flip-flops 145 are coupled between the respective regenerative comparator means 140', 140'' and the DAC 150, in the same manner as the conversion stage of FIG. 8.

Referring to FIG. 12, two pipelines of conversion stages can be multiplexed to form an ADC capable of operating at twice the conversion rate of a single pipeline. A first pipeline of conversion stages $S'_i$, i=1,N operates to sample in odd numbered stages during a first phase $\Phi_1$ of a two-phase clock and the even numbered stages sample during a second phase $\Phi_2$ of the two-phase clock, and a second pipeline of conversion stages $S''_i$, i=1,N operates to sample in odd numbered stages during the second phase $\Phi_2$ of the two-phase clock and the even numbered stages sample during the first phase $\Phi_1$ of the two-phase clock. Therefore, the initial current $r_0$ is sampled twice in each clock cycle. An initial S/H stage 11 samples the initial current $r_0$ and supplies the sampled current alternately to each pipeline. The table of FIG. 16 summarises the states of the ADC elements for each phase, $\Phi_1, \Phi_2$, of a two-phase clock and for odd and even conversion stages $S_i$, for the ADC of FIG. 12 having two multiplex pipelines and comprising the conversion stage of FIG. 3. Alternatively, the ADC of FIG. 12 may comprise the conversion stage of FIG. 8.

FIG. 17 illustrates a S/H circuit suitable for use as the initial S/H stage 11. It employs first and second class-A switched current memory cells $M_1$ and $M_2$ which are operated in a time-division multiplex regime, taking two samples in each clock cycle. On phase $\Phi_1$ the initial current $r_0$ sums with bias current J and the current $J+r_0$ is sampled by the first memory cell $M_1$. Simultaneously, the current $r'_o$ held in the second memory cell $M_2$ flows to the first pipeline of conversion stages $S'_i$, i=1,N. On phase $\Phi_2$, the second memory cell $M_2$ samples the initial current $r_0$ while the current $r''_o$ held in the first memory cell $M_1$ flows to the second pipeline of conversion stages $S''_i$, i=1,N. When the S/H circuit in FIG. 17 is used to supply a non-multiplexed output current, the currents $r'_0$ and $r''_0$ can be summed to form a single output current $i_o$, as indicated by the dotted line in FIG. 17. In practice, all the switches in FIG. 17 are MOS transistors (normally NMOST's) which are turned on and off by the clock waveforms. The sampling instants are defined by the falling edges of the $\Phi'_1$ and $\Phi'_2$ clock waveforms illustrated in FIG. 18. The memory switches operated by clock waveforms $\Phi'_1$ and $\Phi'_2$ are opened before the initial current $r_0$ is interrupted by $\Phi_1$ and $\Phi_2$ respectively. Any difference in the timing or shape of the falling edges of $\Phi'_1$ and $\Phi'_2$ will produce a sampling error and this can produce spurious frequencies in the output currents $r'_0$ and $r''_0$. Further errors can result from an inadequate memory bandwidth. On the input phase of each memory cell $M_1$, $M_2$, the drain current of the memory cell's transistor attempts to follow the initial current $r_0$ but with an inevitable lag. In such class-A memory cells the transconductance is signal dependent because of the MOST's square-law behaviour in saturation and this makes the lag signal-dependent and the sampling errors that result can produce distortion. As an alternative to using the class-A switched current memory cells $M_1$, $M_2$, class-AB switched current memory cells, such as those described in relation to FIG. 4, can be used in the S/H circuit of FIG. 17.

FIG. 19 illustrates an alternative S/H circuit suitable for use as the initial S/H stage 11, but which overcomes the disadvantages of the S/H circuit of FIG. 17. It comprises a time-multiplexed pair of class-AB memory cells $M_3$ and $M_4$, each with a different memory switch arrangement. The operation is the same as described above for the S/H circuit of FIG. 17, except that clock phases $\Phi'_1$ and $\Phi'_2$ are replaced by a double frequency clock $\Phi_0$ and its inverse $\overline{\Phi_0}$. This memory switch combination ensures that the memory cell $M_3$ tracks the initial current $r_0$ when the $\Phi_0$ and $\Phi_1$ switches within the memory cell $M_3$ are closed and memory cell $M_4$ tracks the initial current $r_0$ when the $\Phi_0$ and $\Phi_2$ switches within the memory cell $M_4$ are closed. In each case the sampling instant is determined by the falling edge of the $\Phi_0$ clock and the clock mismatch problem is avoided. An input switch 12 closing on phase $\overline{\Phi_0}$ ensures a continuous path for the initial current $r_0$ during the time intervals in the sampling phases when the input paths to both memory cells $M_3$ and $M_4$ are interrupted. $\overline{\Phi_0}$ is generated from $\Phi_0$ by means of an inverter which introduces a short delay, and consequently safeguards against premature interruption of the initial current $r_0$. The use of class-AB, rather than class-A, memory cells reduces signal dependent errors. This arises because, unlike the class-A cell, the PMOS/NMOS pairs maintain a near signal-independent transconductance. Consequently, the class-AB memory cells $M_3$, $M_4$ with finite bandwidths track the initial current $r_o$ with a fairly constant time lag over large signal amplitude variations and so causes less distortion. Furthermore, the charge injection which occurs when the memory switches open produce a nearly constant gain error which again results in little distortion. When the S/H circuit in FIG. 19 is used to supply a non-multiplexed output current, the currents $r'_0$ and $r''_0$ can be summed to form a single output current $i_o$, as indicated by the dotted line in FIG. 19.

Optionally the ADC of FIG. 12 having two multiplex pipelines may comprise the means for generating $p_i$ and $q_i$ as described above for use in an RSD algorithm.

Optionally more than two pipelines may be multiplexed, and these may each comprise the means for generating $p_i$ and $q_i$.

Optionally, the conversion stage described with reference to FIG. 11 can have more than the two mirror outputs 132, 133 to enable more than two quantisation levels to be implemented, and in this case the DAC 150' would be correspondingly modified to accommodate the increased number of quantisation levels. The RSD algorithm may be extended to accommodate more than two quantisation levels.

Optionally alternative configurations of circuit may be used for the current memory means 130.

Optionally alternative configurations of circuit may be used for the DAC 150 or 150'.

Optionally each conversion stage may generate n bits by employing a comparator means 140, 140', 140" having an appropriate number of quantisation levels and a DAC 150, 150' capable of converting n bits.

Optionally the ADC and its constituent elements may comprise single-ended circuits instead of the balanced circuits described above.

Referring to FIG. 13, a wireless receiver comprising an ADC in accordance with the invention comprises a signal input 500 for receiving a RF signal from an antenna 490. The signal input 500 is coupled to an input of an RF filter 510 for filtering out signals in unwanted frequency bands. An output of the RF filter 510 is coupled to a low noise amplifier (LNA) 520 for amplifying the filtered signal. An output of the LNA 520 is coupled to a first input of first and second mixers 530, 540 for down-conversion. A second input of the first mixer 530 is coupled to a local oscillator source 550 and a second input of the second mixer 540 is coupled to the local oscillator source 550 via a 90° phase shifting network 560. The first and second mixers 530, 540 provide on respective outputs in-phase and quadrature-phase down converted signals I, Q, and these outputs are coupled to respective inputs of anti-alias filters 570. The anti-alias filters 570 provide filtered I and Q signals on respective outputs which are coupled to respective ADCs 580, 590 for digitisation of the filtered I and Q signals. The ADCs 580, 590 are in accordance with the first aspect of the invention. An output from each ADC 580, 590, providing respectively digitised I and Q signals, is coupled to a digital signal processor 600 which applies channel filtering, demodulates the digitised I and Q signals and delivers data on an output 610.

In the present specification and claims the word "a" or "an" preceding an element does not exclude the presence of a plurality of such elements. Further, the word "comprising" does not exclude the presence of other elements than those listed.

From reading the present disclosure, other modifications will be apparent to persons skiled in the art. Such modifications may involve other features which are already known in the design, manufacture and use of analogue-to-digital converters, wireless receivers or switched-current circuits, and which may be used instead of or in addition to features already described herein.

The invention claimed is:

1. A current mode pipelined analogue-to-digital converter (ADC) comprising a plurality of serially connected conversion stages ($S_i$) wherein at least one conversion stage comprises, a stage input for receiving a current ($r_{i-1}$) for conversion, a sample-and-hold (S/H) circuit coupled to sample the current at the stage input during a first time period and to hold the sampled current during a second time period, the S/H circuit having first and second outputs, the first output delivering a mirror of the sampled current during the first time period and a mirror of the held current during the second time period and the second output delivering the held current directly during the second time period, a current comparator means having an input coupled to the first output of the S/H circuit for comparing a current at said input with one or more reference currents, a digital output coupled to an output of the current comparator means for producing a digital signal (D) representing the digital conversion performed by the stage, a digital-to-analogue converter (DAC) having an input coupled to the output of the current comparator means, and a summing means having a first input coupled to an output of the DAC, a second input coupled to the second output of the S/H circuit, and an output for delivering a residual current ($r_i$) during the second time period.

2. An ADC as claimed in claim 1, wherein the S/H circuit comprises a plurality of first outputs each delivering a mirror of the sampled current during the first time period and a mirror of the held current during the second time period, and further comprising a plurality of current comparator means each having an input coupled to a respective one of the first outputs of the S/H circuit for comparing a current at said input with one or more respective reference currents, and wherein the digital output is coupled to an output of each of the current comparator means for producing a digital signal ($D_p$, $D_q$) representing the digital conversion performed by the stage, and wherein the DAC has a plurality of inputs each of said inputs respectively coupled to the output of a respective one of the current comparator means.

3. An ADC as as claimed in claim 1, wherein the operations during the first and second time periods are interchanged for adjacent conversion stages.

4. An ADC as claimed in claim 3, comprising two or more pluralities of serially interconnected conversion stages ($S'_i$, $S_i''$) operating in parallel wherein the operations during the first and second time periods are multiplexed for corresponding parallel conversion stages.

5. An ADC as as claimed in claim 1, wherein the current comparator means (140) comprises a non-regenerative circuit (140').

6. An ADC as as claimed in claim 1, wherein the current comparator (140) means comprises a regenerative circuit (141).

7. An electronic device comprising a current mode pipelined analogue-to-digital converter as as claimed in claim 1.

8. An electronic device as claimed in claim 7, wherein the electronic device is a wireless receiver or transceiver.

* * * * *